(12) United States Patent
Hunt et al.

(10) Patent No.: US 8,773,926 B2
(45) Date of Patent: Jul. 8, 2014

(54) METHOD FOR ROBUST PREAMBLE LOCATION IN A DQS SIGNAL

(75) Inventors: Brandon L. Hunt, Colorado Springs, CO (US); Michael S. Fry, Colorado Springs, CO (US)

(73) Assignee: LSI Corporation, San Jose, CA (US)

( * ) Notice: Subject to any disclaimer, the term of this patent is extended or adjusted under 35 U.S.C. 154(b) by 358 days.

(21) Appl. No.: 13/370,815

(22) Filed: Feb. 10, 2012

(65) Prior Publication Data
US 2013/0208553 A1     Aug. 15, 2013

(51) Int. Cl.
*G11C 7/00*     (2006.01)
(52) U.S. Cl.
USPC .... 365/193; 365/194; 365/233.1; 365/233.13
(58) Field of Classification Search
CPC ..................................... G11C 8/18; G11C 7/00
USPC .......................... 365/193, 194, 233.1, 233.13
See application file for complete search history.

(56) References Cited

U.S. PATENT DOCUMENTS

| | | | |
|---|---|---|---|
| 6,600,681 B1 | 7/2003 | Korger et al. | |
| 7,869,287 B2 * | 1/2011 | Searles et al. | 365/194 |
| 7,911,857 B1 * | 3/2011 | Venkataraman et al. | 365/189.15 |
| 2010/0246290 A1 * | 9/2010 | MacLaren et al. | 365/193 |
| 2011/0199843 A1 | 8/2011 | Dreps et al. | |
| 2012/0307577 A1 * | 12/2012 | Sriadibhatla et al. | 365/193 |

* cited by examiner

*Primary Examiner* — Toan Le
(74) *Attorney, Agent, or Firm* — Suiter Swantz pc llo

(57) ABSTRACT

A method for robust preamble location and gate training in a Double Data Rate type Three (DDR3) computing environment. A single algorithm is employed to begin sampling a Data Strobe Signal (DQS) at a maximum delay value designed to fall within the driven region of a DQS. The method then begins sampling the DQS in a sequence of delay values from right to left. Each result of the sampling indicating a high state and a low state are stored as well as the occasions where the DQS transitioned from high to low indicating a rising edge. At a consecutive number of samples returning a low state, the method determines the preamble has been reached and discontinues sampling. The method retains the most recently stored rising edge as the first rising edge and configures the result for gate training.

20 Claims, 5 Drawing Sheets

---

300

| | |
|---|---|
| 302 | receiving a maximum delay value and a step size |
| 304 | sampling said DQS at said maximum delay value |
| 306 | sampling said DQS in a sequence of delay values, a greatest delay value in said sequence of delay values being one step size less than said maximum delay value, each delay value of said sequence of delay values being one step size less than a proximal delay value, said sequence of delay values beginning with said greatest delay value |
| 308 | storing at least one delay value when said sampling indicates said DQS was at a high |
| 310 | storing at least one delay value when said sampling indicates said DQS was at a low |
| 312 | storing at least one delay value when said sampling indicates said DQS made a transition from said high to said low |
| 314 | determining and storing an earliest location of said transition from said high to said low |
| 316 | storing a preamble location and discontinuing said sampling when, during a single clock cycle, said sampling indicates a number of consecutive instances of said DQS being at said low, said number of consecutive instances based on a multiple of said step size |
| 318 | capturing a Data Lane signal (DQ) based on said stored preamble location and said earliest location of said transition from said high to said low |

300

302 — receiving a maximum delay value and a step size

304 — sampling said DQS at said maximum delay value

306 — sampling said DQS in a sequence of delay values, a greatest delay value in said sequence of delay values being one step size less than said maximum delay value, each delay value of said sequence of delay values being one step size less than a proximal delay value, said sequence of delay values beginning with said greatest delay value 308 — storing at least one delay value when said sampling indicates said DQS was at a high 310 — storing at least one delay value when said sampling indicates said DQS was at a low 312 — storing at least one delay value when said sampling indicates said DQS made a transition from said high to said low 314 — determining and storing an earliest location of said transition from said high to said low 316 — storing a preamble location and discontinuing said sampling when, during a single clock cycle, said sampling indicates a number of consecutive instances of said DQS being at said low, said number of consecutive instances based on a multiple of said step size 318 — capturing a Data Lane signal (DQ) based on said stored preamble location and said earliest location of said transition from said high to said low

FIG. 3

| | |
|---|---|
| 402 | receiving a maximum delay value and a step size |
| 404 | sampling a plurality of DQS at the maximum delay value |
| 406 | sampling, concurrently and in parallel, said plurality of DQS in a sequence of delay values, a greatest delay value in said sequence of delay values being one step size less than said maximum delay value, each delay value of said sequence of delay values being one step size less than a proximal delay value, said sequence of delay values beginning with said greatest delay value |
| 408 | storing at least one delay value when said sampling indicates said DQS was at a high |
| 410 | storing at least one delay value when said sampling indicates said DQS was at a low |
| 412 | storing at least one delay value when said sampling indicates said DQS made a transition from said high to said low |
| 414 | determining and storing an earliest location of said transition from said high to said low |
| 416 | storing a preamble location and discontinuing said sampling for each of said plurality of DQS when, during a single clock cycle, said sampling indicates a number of consecutive instances of said DQS being at said low, said number of consecutive instances based on a multiple of said step size |
| 418 | capturing, concurrently and in parallel, a plurality of Data Signals (DQ) based on said stored preamble location and said earliest location of said transition from said high to said low |

400 ⤴

FIG. 4

METHOD FOR ROBUST PREAMBLE LOCATION IN A DQS SIGNAL

TECHNICAL FIELD

The present disclosure relates generally to the field of data transfer in a computing environment and more specifically to a robust method for location of a DQS signal preamble on a DDR3 data path.

BACKGROUND

Hardware devices operating in a computing environment must communicate efficiently and with great speed to compete. Synchronous Dynamic Random Access Memory (SDRAM) devices, specifically Double Data Rate type Three (DDR3) SDRAM devices may be of value to a hardware manufacturer and a user. In order for a DDR3 SDRAM device to receive a communication from a controller, the controller may send a Data Lane (DQ) signal and a Data Strobe Signal (DQS) to the DDR3 SDRAM. A separate DQ and DQS may be concurrently sent on multiple paths (lanes) from controller to memory increasing transfer bandwidth. During a period of no communication, the DQS may be in a state known as "tri-state" where the DQS signal is at an unpredictable voltage level. As the SDRAM controller prepares to send a communication signal, it may first drive the DQS to a low state indicating to the SDRAM a DQ data line is forthcoming. This DQS low state is known as the preamble indicating to the SDRAM that a following DQ is on the way. One challenge for the SDRAM controller is to recognize this low state of the DQS to enable an AND gate to open for the SDRAM to receive the DQ data signal. Efficient recognition and location of the DQS preamble preceding the DQ may enable the SDRAM controller to train the AND gates for each lane to timely open allowing for proper timing of communication and capture of a valid data signal.

For DDR3, there is a DQS signal for every individual data path transiting the memory system. As the controller may send a signal, a first indicator that a signal is in transit may be when the DQS is driven from a tri-state to a low state. This DQS low state may indicate a valid DQ is en route from transmission source to reception destination and may be of at least one or more clock cycles in duration. Should the AND gate be closed the communication will not occur. However, if the gates are timed or "trained" correctly, proper communication will be received. For example, a single algorithm employed that ensures the first sample taken by the algorithm is within the driven region of the DQS may eliminate a need for trial and error sampling to determine if the first sample is within the DQS.

Previous attempts at preamble location have focused on random DQS sampling, progressive (low to high) or (left to right) DQS sampling, and delay value trial and error to sample the DQS in an attempt to find the time when the DQS was driven initially to a low state (the preamble). These attempts may begin sampling a DQS at a minimum delay value of zero and work "left to right" increasing the delay value by a step size and sampling again. This left to right method maintains no guarantee of positioning the first sample taken to be within the actively driven DQS. Additionally, a method of sampling a DQS in search of a first rising edge, may not know from where along the DQS the sample is taken rendering the method useless. Where a sample is taken from outside the actively driven DQS in the tri-stated region, random results have been observed increasing time or decreasing possibilities of preamble location and ultimately, wasting computing resources. Therefore, it is imperative the "preamble" is found first, in order to know which rising edge is the first rising edge of the DQS, and that the DQS signal is valid instead of in a tri-stated region.

U.S. Pat. No. 6,600,681 B1 to Korger et al., discloses a method for calibrating DQS qualification in a memory controller. Korger samples a DQS from a minimum delay value to a maximum delay value in an attempt to locate the preamble. However, Korger samples the DQS from left (minimum) to right (maximum) in preamble location. Such left to right sampling has proven to return arbitrary results and require a considerable number of sampling iterations before a preamble may be located.

Similarly, United States Patent Application Publication No. US 2011/0199843 A1 to Dreps et al., discloses a method and apparatus for strobe offset in bi-directional memory strobe configurations. Dreps purports to sweep a delay value from right to left, however, Dreps maintains trial and error associated with multiple iterations of a DQS sweep to eventually locate the preamble.

Therefore, it would be advantageous if a method were disclosed which provides for efficient and robust DQS preamble location and gate training while in training mode, without resorting to a resource consuming method incorporating trial and error.

SUMMARY

In a preferred aspect of the current invention, a method for capturing a Data Lane Signal (DQ) by determining a preamble location in a Data Strobe Signal (DQS), includes using a computer device or processor to perform the steps of: receiving a maximum delay value and a step size, sampling the DQS at the maximum delay value, sampling the DQS in a sequence of delay values, a greatest delay value in the sequence of delay values being one step size less than the maximum delay value, each delay value of the sequence of delay values being one step size less than a proximal delay value, the sequence of delay values beginning with the greatest delay value, storing at least one delay value when the sampling indicates the DQS was at a high, storing at least one delay value when the sampling indicates the DQS was at a low, storing at least one delay value when the sampling indicates the DQS made a transition from the high to the low, determining and storing an earliest location of the transition from the high to the low, storing a preamble location and discontinuing the sampling when, during a single clock cycle, the sampling indicates a number of consecutive instances of the DQS being at the low, the number of consecutive instances based on a multiple of the step size, and capturing a DQ based on the stored preamble location.

In an additional aspect of the present invention, a method for gate training in a DDR3 environment and for simultaneously determining a location of a preamble in a plurality of Data Strobe Signals (DQS) across a corresponding plurality of data lanes, the method comprises using a computer device or processor to perform the steps of: receiving a maximum delay value and a step size, sampling the plurality of DQS at the maximum delay value, sampling, concurrently and in parallel, the plurality of DQS in a sequence of delay values, a greatest delay value in the sequence of delay values being one step size less than the maximum delay value, each delay value of the sequence of delay values being one step size less than a proximal delay value, the sequence of delay values beginning with the greatest delay value, storing at least one delay value when the sampling indicates the DQS was at a high, storing at least one delay value when the sampling indicates the DQS was at a low, storing at least one delay value when the sampling indicates the DQS made a transition from the high to the low, determining and storing an earliest location of the transition from the high to the low, training a series of gates corresponding to the plurality of data lanes based on a result of the determining and storing an earliest location of the transition, storing a preamble location and discontinuing the sampling for each of the plurality of DQS when, during a single clock cycle, the sampling indicates a number of consecutive instances of the DQS being at the low, the number of consecutive instances based on a multiple of the step size, capturing, concurrently and in parallel, a plurality of Data Signals (DQ) based on the stored preamble location.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which:

FIG. 3 is a flow diagram illustrating a method for preamble location in a preferred embodiment of the present invention;

FIG. 4 is a flow diagram illustrating a method for preamble location on a plurality of concurrent signals in conformance with a preferred embodiment of the present invention.

DETAILED DESCRIPTION

Reference will now be made in detail to the subject matter disclosed, which is illustrated in the accompanying drawings.

Referring generally to FIGS. 1-5, method 100 may be employed to locate a preamble of a plurality of Data Strobe Signal (DQS) signals transiting a corresponding plurality of electronic memory or data lanes. Additionally, method 100 may incorporate gate training as a beneficial by-product of the preamble location technique by storing each location of a rising edge of a DQS. Further, method 100 refrains from a time consuming trial and error concept and uses data analysis to determine a starting location on the DQS signal from which the method may begin sampling the DQS. In addition, this data analysis may provide method 100 immunity to problems associated with sampling while the signal is tri-stated.

Figure 1:
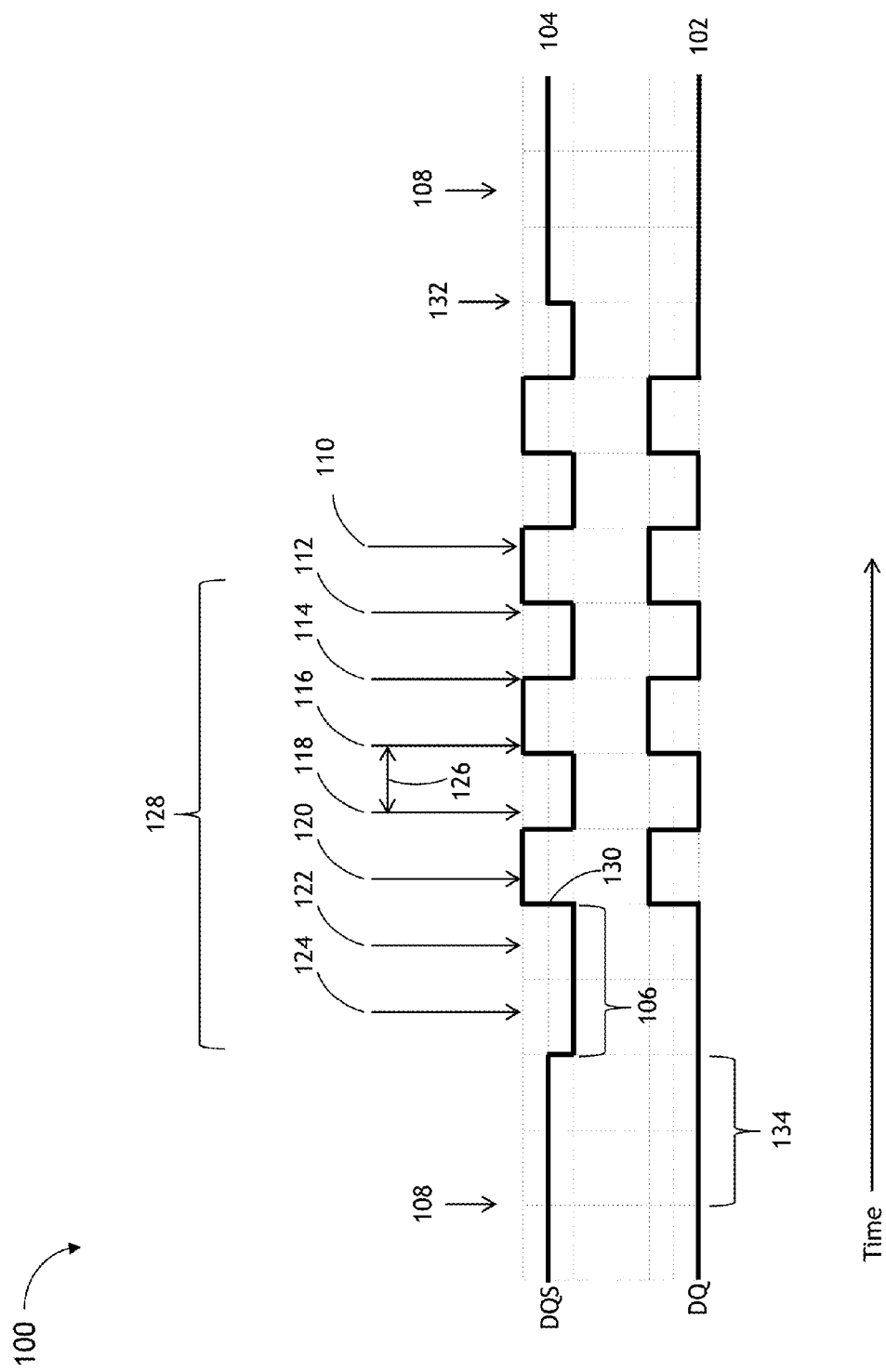
FIG. 1 is a diagram of a DQS data strobe illustrating a preferred embodiment of the present invention.

Referring to FIG. 1, a diagram of a DQS data strobe illustrating a preferred embodiment of the present invention is shown. DQ 102 and DQS 104 are plotted with respect to time from left to right. DQS 104 is shown at a tri-stated region 108 both before and after the valid DQ 102 is transmitted along the data lane. The DQS 104 may be the first indicator a DQ 102 is forthcoming by being driven low at the beginning 132 of the preamble 106. DQS 104 then transitions from low to high at a first rising edge 130. The DQS cycles high and low throughout the signal finally returning to a tri-stated region 108 at the signal end. DQ 102 follows the DQS 104 in cycling high and low carrying actual data on each clock cycle 134 to and from memory.

Maximum Delay Value

Preferably, method 100 may receive a maximum delay value 110 and a step size 126 in order to begin sampling the DQS 104. The maximum delay value 110 may be generally defined as the first value (a point in time along the DQS) at which the method 100 may sample the DQS 104. One goal of the present invention may include a first sample falling within the actively driven DQS (between the two tri-stated regions 108). A sample taken from outside the actively driven range (in the tri-stated region 108) may return random results and take an increased time to properly and efficiently locate the preamble 106. In determining a maximum delay value 110 under a preferred embodiment, method 100 may analyze a plurality of variables including;

1) a range of delays for a specific memory system;
2) a latency value of a column to address strobe (CAS);
3) a hardware constant;
4) a frequency of a memory clock; and
5) a determination if a register is located between a SDRAM and a controller.

For example, a user may analyze a range of delays in a given memory system from experience working with the system be able to narrow the possibilities of the maximum delay value 110 falling within the actively driven DQS signal. A column to address strobe (CAS) latency may provide information to the method of proper placement of the maximum delay value. For example, a given latency value may remain constant over multiple instances of data lane use allowing a foreseeable result in a future use. A Hardware constant and memory clock may include repetitive variables which may maintain constant behavior over time. Further, a register located between a SDRAM memory and a controller may have a latency effect on transmission time allowing for predictable results over time. FIG. 1 displays a maximum delay value 110 on the DQS at a position anticipated for exemplary discussion. The actual location of the maximum delay value may vary but will preferably remain within the actively driven region of the DQS 104.

Step Size

Step size 126, referring to a period of time, may be generally defined as the difference in delay value method 100 may calculate between DQS samples. Various step sizes 126 may have inversely proportional results. For example, the larger the step size, the time required to traverse the entire DQS may be reduced (positive) however, the accuracy of locating specific points along the DQS may be reduced (negative). The smaller the step size 126, accuracy of location may be increased (positive) while time required to locate such points may increase (negative). Further, step size 126 may be variable by a user or alternatively, by a controller within the computing device or processor. Trade-offs between accuracy and sample time consumed may be weighed to determine a preferred step size.

Method 100 may begin sampling the DQS 104 at the maximum delay value 110. A result of the sampling may return an indication of one of two states of the DQS; 1) High, or 2) Low. Method 100 then works to the left sampling the DQS 104 at a sequence of delay values 128, the sequence beginning with a greatest delay value 112 of the sequence 128, the greatest delay value defined as one step size 126 less than the maximum delay value 110. The method 100 continues to sample the DQS 104 in sequence at FIG. 1 points 114-124. For example, a maximum delay value may be given at 550 picoseconds (ps) with a step size of 65 ps. Method 100 may preferably command DQS samples be taken in order beginning with 550 and following the sequence from greatest to least (right to left):

[550, 485, 420, 355, 290, 225, 160, 95, 30]

As method 100 samples the DQS from right to left at each delay value in the sequence, it stores the result. Additionally, method 100 may store a location where a result indicates the DQS 104 transitioned from high to low. Storing this transition from high to low (a leading edge) allows method 100 to accomplish gate training as a result of storing the results. Specifically, the first rising edge 130 is of particular value to method 100 since the first rising edge 130 may aid in locating the preamble 106. Before locating the preamble, by storing the most recently found rising edge when traversing backwards through the DQS, method 100 may concurrently find a specific key element for follow on gate training.

In order to obtain a preferred step size 126, method 100 may combine digital delays (large or coarse) with analog delays (fine or small) to achieve a desired result. Method 100 may ensure the proper number of digital and analog delays needed for each step of the step size, so that each step size is the same number of picoseconds. Preferably, method 100 used fixed step size vs. a run-time varying step size. A run-time varying step size may yield faster results (by stepping larger at first then smaller as it approaches the preamble), and is contemplated below.

Preamble Location

To locate the preamble, as method 100 samples the DQS from right to left, it looks for a situation where sampling returns a number of consecutive low instances within one clock cycle. The number of consecutive low instances is a function of the step size and the clock cycle. For example, in FIG. 1, samples 122 and 124 both return a low result within one clock cycle 134. Such result may clearly indicate a preamble location at values 124 and 122. In this example, given the step size and clock cycle in FIG. 1, the number of consecutive low instances to indicate a preamble may likely be 2. Given a decreased step size 126 and a constant clock 134, the number of consecutive low instances to positively indicate a preamble would increase.

Method 100 may operate on a plurality of data lanes individually and in parallel. Within a plurality of DRAM data lanes, a DQS 104 may be driven low at a different time for each DRAM data lane. Method 100 may analyze the plurality of DRAM data lanes individually and in parallel finding a preamble, locating a first rising edge, and performing gate training for each data lane. Thus, method 100 may accomplish these tasks on a first run through a DQS 104, providing efficiency of resources while maximizing speed of task accomplishment.

Although method 100 may locate the preamble 106 on each DRAM data lane at a different point in time (different delay), it may use the same step size 126 on each DRAM data lane as it analyzes each lane. One benefit of keeping the step size same on all lanes while sampling right to left on the DQS 104, may include more consistent and reliable results. As part of DDR3 gate training, method 100 may be incorporated before "read leveling" and "write leveling" algorithms are performed. Method 100 may operate to replace both a preamble-finder algorithm (or combination of algorithms) as well as a gate training algorithm.

In this implementation, method 100 may be incorporated in firmware, as part of the DDR3 firmware library. Alternatively, method 100 may also be automated in hardware, and may also be included in hardware-driven training implementations.

Display of Results

Figure 2:
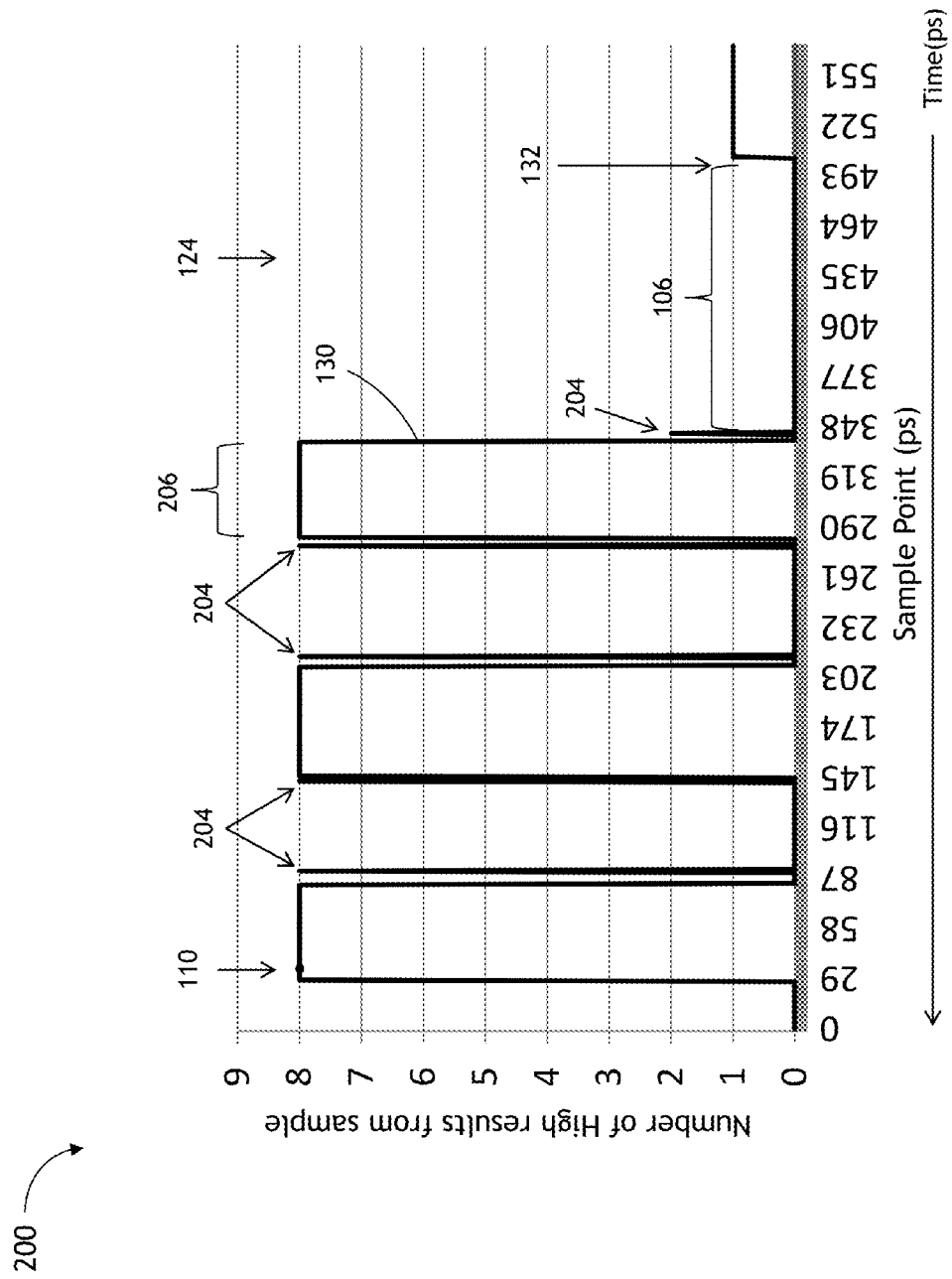
FIG. 2 is a diagram of debug results of a DQS data strobe illustrating a preferred embodiment of the present invention.

Referring to FIG. 2, debug results for eight repeat operations of a preferred method of the present invention is shown. One of many advantages of the preferred method may include, while traversing the DQS, debug may be enabled allowing user analysis of results. A format of results into a graph may represent the DQS, which may be a useful alternative to oscilloscope analysis. FIG. 2 displays time on the horizontal or x axis and a number of high results from a sample on the vertical or y axis. Of note, FIG. 2 is oriented with time charted from right to left displaying the first sample taken on the left of the graph. Maximum delay value 110 is displayed on the left of the graph as the first sample taken but is the greatest delay value for which a sample is taken. Final sample 124 is displayed on the right of the graph indicating the last sample taken in preamble location. FIG. 2 may be considered a mirror image of FIG. 1 since it may include a result of eight samples of the DQS 104. For example, at time 319, all eight repeat operations of method 200 returned a high result while at time 116, all eight repeat operations of method 200 did not return high result.

Method 200 may be commanded to repeat a number of times for each DQS 104 to increase accuracy of preamble location and enable a user to analyze the signal. For example, operation of method 200 once per DQS may return certain results. Operation of method 200 eight times per DQS may return eight distinct results where an average may return a more accurate picture of the sampled DQS. A higher repeat value in this regard consumes more time, but may indicate noise presence on the signal.

Method 200 may also provide accurate representation of the DQS for future user analysis. Imperfections 204 of DQS 104 may be present in a DQS 104 indicating some uncertainty for which method 200 may be configured to account. Method 200 may display the width of one DQS strobe 206 as half of one clock cycle in duration beginning with a first rising edge 130 of the sampled DQS 104. As displayed, one clock cycle may be approximately 130 ps in duration with a near 50% duty cycle of the DQS signal 104. An ending point of the tri-stated area 132 may indicate a beginning of the preamble 106. Since one of the eight samples indicated a high result in the tri-stated area, there exists some level of minor inconsistency in the high impedance state.

Logic

Referring to FIG. 3, a flow diagram illustrating a method for preamble location in a preferred embodiment of the present invention is shown. At step 301 method 300 may receive a maximum delay value and a step size. The maximum delay value may be a result of variables associated with a specific memory system, CAS latency values, hardware constants, the frequency of the memory clock in use, and whether a register is present between the SDRAM and controller. The maximum delay value may further include a range of values within the actively driven range of the DQS. For example, a maximum delay value of 550 ps may be used by method 300 to begin the sampling. However, it is further contemplated, for example, a maximum delay value of within a range from 500 to 545 may also produce satisfactory results. The step size associated with the method 300 may be generated by a user, by the computer device, and by the processor in use. The step size may be of linear curvature where a constant, equal step size is taken by method 300 to sample the DQS. It is further contemplated a non-linear step size may be incorporated into method 300 taking unequal steps in sampling the DQS. For example, method 300 may begin at a delay value of 550 ps and start with a step size of 50 ps, reducing the step size by 2 ps per step. Samples under this example may be taken at: 550, 500, 452, 406, 362, 320, 280, 242, 206, 172, . . . . Further, it is contemplated a step size curve of exponentially decreasing values as the samples approach a preamble may be incorporated to method 300.

Method 300 begins sampling the DQS at step 306. Method 300 samples the DQS in a sequence of delay values, a greatest delay value in the sequence of delay values being one step size less than the maximum delay value, each delay value of the sequence of delay values being one step size less than a proximal delay value, the sequence of delay values beginning with the greatest delay value. The sequence may begin with the maximum delay value and work backwards in time through the sequence. The next sample point being one step size less than the previous sample point. Working backwards in the manner, method 300 may be assured to locate each rising edge of the DQS as well as the preamble 106. Method 300 stored results at each sample point in steps 308-310.

Method 300 may store high and low results but particularly important is storing each transition from high to low indicating a rising edge. As method 300 locates ach rising edge, it stores the most recently found rising edge as the current candidate to become the first rising edge. As method 300 analyzes each result, it continues to look, during a single clock cycle, for a number of consecutive instances of the DQS being at a low. This number depends on step size 126 and clock cycle 134 as variables. When method finds this result, it discontinues sampling and stores the most recent delay values as the preamble. Further, since method 300 has stored the most recent rising edge, method 300 may use the location of the first rising edge to train the memory gates properly configuring the sample results for follow on gate training. Method 300 may then accurately capture a valid DQ at step 318 based on the results of the stored preamble location and the earliest location of the transition from high to low.

Referring to FIG. 4, a flow diagram illustrating a method for preamble location on a plurality of concurrent signals in conformance with a preferred embodiment of the present invention is shown. Method 400 may follow the logic of method 300 as described above concerning sampling and step size. However, method 400 may include a plurality of data lanes analyzed concurrently and in parallel. Method 400 may use a fixed maximum delay value over the plurality of data lanes. Alternatively, method 400 may incorporate a unique delay value for each individual data lane of the plurality of data lanes. Method 400 may sample and store values for each individual data lane paying specific attention to each rising edge of the individual DQS signals in steps 406-414. When, in step 416 method 400 encounters multiple low instances within a single clock cycle, it may discontinue sampling and store the delay value sample location as the preamble. At step 418 method 400 may then capture each DQ from each individual data lane.

Interaction

Figure 5:
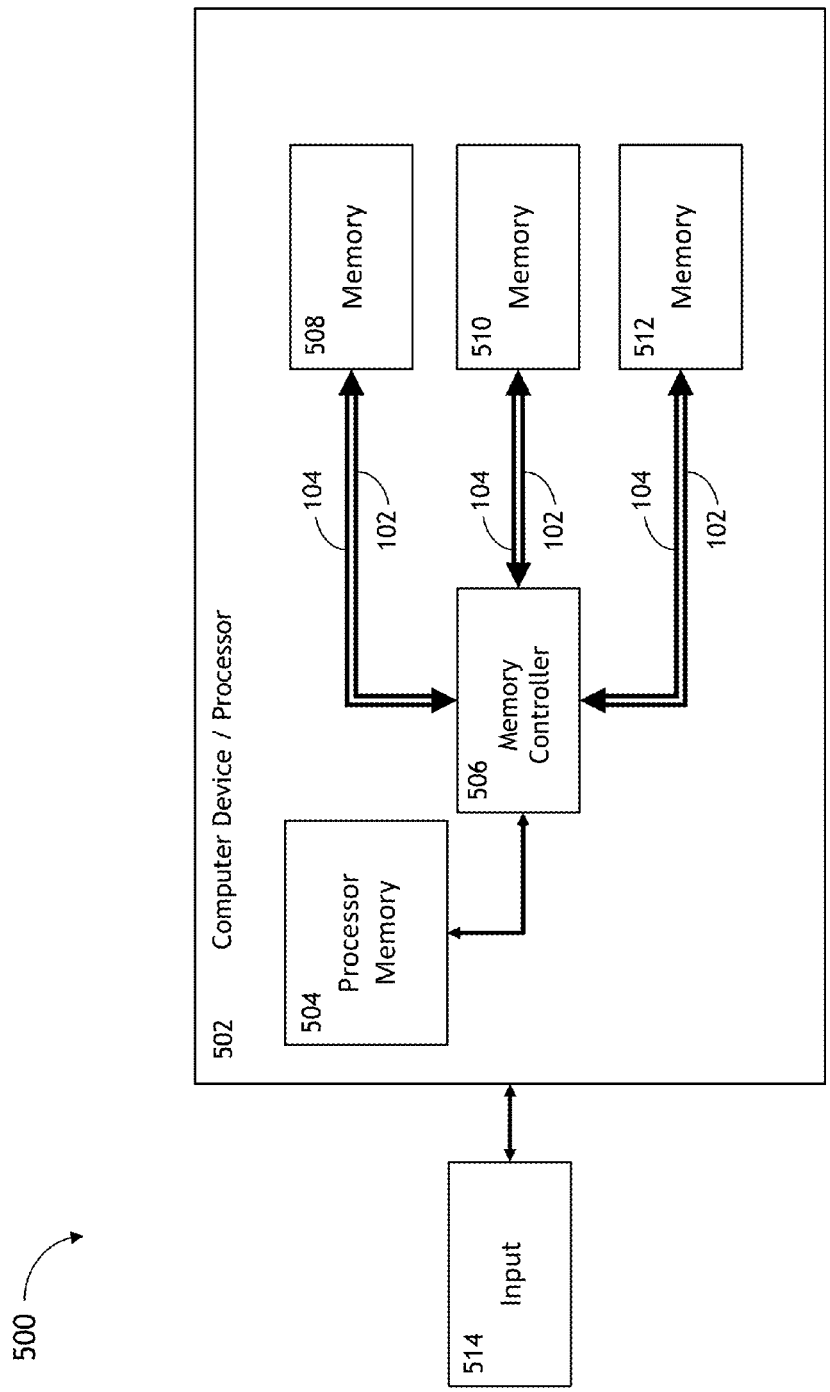
FIG. 5 is a diagram illustrating component interaction in a preferred embodiment of the present invention.

Referring to FIG. 5, a diagram illustrating component interaction in a preferred embodiment 500 of the present invention is shown. Computer device or processor 502 may comprise a processor memory 504, memory controller 506, and a plurality of DRAM memory devices 508, 510, and 512. Processor 502 and processor memory 504 may be in data communication with input 514 and with memory controller 506. Memory controller 506 may be in data communication with memory devices 508, 510, and 512. The communication connection between memory controller 506 and the DRAM memory devices may include a DQS signal 104 and a DQ signal 102 for each of the memory devices.

Computer device/processor 502 and processor memory 504 may operate to implement the steps associated with method 300 and method 400. For example, Computer device/processor 502 and processor memory 504 may receive and store input 514 including a specific delay value and a step size. Since method 300/400 is executed in firmware, the step-size, stored delay values, etc., are stored in the processor 502 and processor memory 504 (the architecture running the firmware). Memory controller 506 may execute the delay specified by processor 502 and return the results from that delay. For example, memory controller 506 may receive commands from processor 502 to execute a specific delay and a step size. Additionally, memory controller 506 may receive and send to processor the earliest location of the transition from high to low of the DQS. Further computer device/processor 502 and processor memory 504 may capture the DQ and perform gate training associated with data communication between the processor memory 504, memory controller 506, and memory devices 508-512.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A method for capturing a Data Lane Signal (DQ) by determining a preamble location in a Data Strobe Signal (DQS), comprising:
    using a computer device or processor to perform the steps of:
    receiving a maximum delay value and a step size;
    sampling said DQS at said maximum delay value;
    sampling said DQS in a sequence of delay values, a greatest delay value in said sequence of delay values being one step size less than said maximum delay value, each delay value of said sequence of delay values being one step size less than a proximal delay value, said sequence of delay values beginning with said greatest delay value;
    storing at least one delay value when said sampling indicates said DQS was at a high;
    storing at least one delay value when said sampling indicates said DQS was at a low;
    storing at least one delay value when said sampling indicates said DQS made a transition from said high to said low;
    determining and storing an earliest location of said transition from said high to said low;
    storing a preamble location and discontinuing said sampling when, during a single clock cycle, said sampling indicates a number of consecutive instances of said DQS being at said low, said number of consecutive instances based on a multiple of said step size; and capturing a DQ based on said stored preamble location and said earliest location of said transition from said high to said low.

2. The method of claim 1, wherein said receiving a maximum delay value and a step size from further comprises an analysis of at least three of:
   a. a range of delays for a specific memory system;
   b. a latency value of a column to address strobe (CAS);
   c. a hardware constant;
   d. a frequency of a memory clock; and
   e. a determination if a register is located between a SDRAM and a controller.

3. The method of claim 1, wherein said maximum delay value is a range.

4. The method of claim 1, wherein said step size is variable by at least one of said computer device, said processor, and a user.

5. The method of claim 1, wherein said sequence of delay values is non-linear.

6. The method of claim 1, wherein said sampling said DQS in a sequence of delay values further, a greatest delay value in said sequence of delay values being one step size less than said maximum delay value, each delay value of said sequence of delay values being one step size less than a proximal delay value, said sequence of delay values beginning with said greatest delay value further comprises repeat operations using said maximum delay value and said step size.

7. The method of claim 1, wherein storing at least one delay value when said sampling indicates said DQS made a transition from said high to said low further includes storing a result configured for gate training.

8. The method of claim 1, wherein said sampling is configured to ignore results received from a sampling of a DQS in a tri-stated region.

9. The method of claim 1, wherein said multiple is 2 or greater.

10. The method of claim 1, wherein results of said sampling are configured for gate training.

11. A method for gate training in a Double Data Rate type Three (DDR3) environment and for simultaneously determining a location of a preamble in a plurality of Data Strobe Signals (DQS) across a corresponding plurality of data lanes, the method comprising:
   using a computer device or processor to perform the steps of:
   receiving a maximum delay value and a step size;
   sampling said plurality of DQS at said maximum delay value;
   sampling, concurrently and in parallel, said plurality of DQS in a sequence of delay values, a greatest delay value in said sequence of delay values being one step size less than said maximum delay value, each delay value of said sequence of delay values being one step size less than a proximal delay value, said sequence of delay values beginning with said greatest delay value;
   storing at least one delay value when said sampling indicates said DQS was at a high;
   storing at least one delay value when said sampling indicates said DQS was at a low;
   storing at least one delay value when said sampling indicates said DQS made a transition from said high to said low;
   determining and storing an earliest location of said transition from said high to said low;
   training a series of gates corresponding to said plurality of data lanes based on a result of said determining and storing an earliest location of said transition;
   storing a preamble location and discontinuing said sampling for each of said plurality of DQS when, during a single clock cycle, said sampling indicates a number of consecutive instances of said DQS being at said low, said number of consecutive instances based on a multiple of said step size; and
   capturing, concurrently and in parallel, a plurality of Data Signals (DQ) based on said stored preamble location and said earliest location of said transition from said high to said low.

12. The method of claim 11, wherein said receiving a maximum delay value and a step size further comprises an analysis of at least three of:
   a. a range of delays for a specific memory system;
   b. a latency value of a column to address strobe (CAS);
   c. a hardware constant;
   d. a frequency of a memory clock; and
   e. a determination if a register is located between a SDRAM and a controller.

13. The method of claim 11, wherein said maximum delay value is at least one of a range, a fixed delay value for all of said plurality of data lanes, and a unique delay value for each individual data lane of said plurality of data lanes.

14. The method of claim 11, wherein said step size is variable by at least one of said computer device, said processor, and a user.

15. The method of claim 11, wherein said sequence of delay values is non-linear.

16. The method of claim 11, wherein said sampling, concurrently and in parallel, said plurality of DQS in a sequence of delay values, a greatest delay value in said sequence of delay values being one step size less than said maximum delay value, each delay value of said sequence of delay values being one step size less than a proximal delay value, said sequence of delay values beginning with said greatest delay value further comprises repeat operations using said maximum delay value and said step size.

17. The method of claim 11, wherein storing at least one delay value when said sampling indicates said DQS made a transition from said high to said low further includes storing a result configured for gate training.

18. The method of claim 11, wherein said sampling is configured to ignore results received from a sampling of a DQS in a tri-stated region.

19. The method of claim 11, wherein said multiple is 2 or greater.

20. The method of claim 11, wherein results of said sampling are configured for a gate training session.

* * * * *